(12) United States Patent
Watson et al.

(10) Patent No.: US 11,415,619 B2
(45) Date of Patent: Aug. 16, 2022

(54) DIGITAL MODULATION/DEMODULATION WITH ACTIVE MONITORING FOR MEASUREMENT OF POWER FACTOR AND CAPACITANCE IN HIGH-VOLTAGE BUSHINGS, TRANSFORMERS, REACTORS, AND OTHER ELECTRICAL EQUIPMENT WITH HIGH-VOLTAGE INSULATION

(71) Applicant: Joe David Watson, Jupiter, FL (US)

(72) Inventors: Joe D. Watson, Jupiter, FL (US); Hemchandra M. Shertukde, Simsbury, CT (US); Rekha H. Shertukde, Simsbury, CT (US)

( * ) Notice: Subject to any disclaimer, the term of this patent is extended or adjusted under 35 U.S.C. 154(b) by 114 days.

(21) Appl. No.: 17/018,516

(22) Filed: Sep. 11, 2020

(65) Prior Publication Data

US 2021/0190851 A1 Jun. 24, 2021

Related U.S. Application Data

(60) Provisional application No. 62/899,941, filed on Sep. 13, 2019.

(51) Int. Cl.
*G01R 31/12* (2020.01)
*G01R 27/26* (2006.01)

(52) U.S. Cl.
CPC ..... *G01R 31/1281* (2013.01); *G01R 27/2605* (2013.01); *G01R 27/2694* (2013.01)

(58) Field of Classification Search
CPC ............ G01R 31/1281; G01R 27/2605; G01R 27/2694; G01R 31/1227
USPC ................................. 324/552, 551, 537, 500
See application file for complete search history.

(56) References Cited

U.S. PATENT DOCUMENTS

| | | | |
|---|---|---|---|
| 2005/0261563 A1* | 11/2005 | Zhou | A61B 5/0031 600/347 |
| 2012/0322050 A1* | 12/2012 | Abassi | G01N 33/5011 435/5 |
| 2014/0119724 A1* | 5/2014 | Chi | H04B 10/071 398/21 |

* cited by examiner

*Primary Examiner* — Giovanni Astacio-Oquendo

(57) ABSTRACT

Systems and methods for measuring the integrity of insulation components in energized or de-energized electrical systems. Using a digital modulation/demodulation system, an active monitoring system adds a modulated high frequency signal to an injected signal and demodulates the resulting signal to provide voltages and currents that are measured and used to determine the capacitances and power factors of the insulation components. Systems may be used for on-line detection and measurement of power factor and capacitance of electrical equipment such as transformers, reactors, and condenser type bushings. The present disclosure is especially applicable to the electrical power industry.

9 Claims, 3 Drawing Sheets

DIGITAL MODULATION/DEMODULATION WITH ACTIVE MONITORING FOR MEASUREMENT OF POWER FACTOR AND CAPACITANCE IN HIGH-VOLTAGE BUSHINGS, TRANSFORMERS, REACTORS, AND OTHER ELECTRICAL EQUIPMENT WITH HIGH-VOLTAGE INSULATION

CROSS-REFERENCE TO RELATED APPLICATIONS

This application claims priority to U.S. Provisional Patent Application No. 62/899,941, filed Sep. 13, 2019. The entire disclosure of U.S. Provisional Patent Application No. 62/899,941 is incorporated herein by reference.

FIELD OF THE INVENTION

This application relates to active-monitoring systems for high-voltage bushings, transformers, reactors, and related equipment with high-voltage insulation and methods of making and using the same. The embodiments described herein may be used on any such equipment in a de-energized or energized condition.

BACKGROUND

High-voltage equipment such as bushings, transformers, reactors, and related equipment, with high-voltage insulation systems, may be constructed with solid, liquid, or a combination of solid and liquid dielectric insulation materials. The dielectric strength of the components and physical dimensions of the insulation system can be evaluated by the capacitance and power-factor values of each part of the system. Active-monitoring systems allow more complete testing of energized equipment by injecting low-energy signals into the energized equipment, while effectively isolating the low-energy signals from the high-voltage, high-current signals in the energized equipment, and measuring the magnitudes and phase angles of the resulting signals to determine the capacitance and power-factor values of the various parts of the component insulation system.

Examples of active-monitoring systems for measuring integrity of insulation components in electrical systems are described in U.S. Pat. No. 9,945,896 (Watson). The entire disclosure of U.S. Pat. No. 9,945,896 is incorporated herein by reference.

SUMMARY

According to one aspect of the present disclosure, an active monitoring system may include: a modulating portion for generating a digital signal by modulating an input signal, and for injecting the digital signal into a high-voltage device; and a demodulating portion for receiving a digital output signal from the high-voltage device, and for demodulating the digital output signal to determine the power factor and capacitance values of an insulation system for the high-voltage device.

According to another aspect of this disclosure, the complete system assesses the health condition of electrical power equipment by measuring the power factor of the equipment insulation structure by injecting a modulated low-energy signal in real time at different points at high frequency (for example, a sinusoidal signal in the 10 kHz to 100 kHz range), into a power transformer energized at electrical grid voltages to 1500 kV or greater at a 50 or 60 Hz signal frequency and measure the magnitude and phase angle of the resulting signals at multiple other points in the transformer to evaluate transformer condition and the health of the components of the insulation system.

According to another aspect of this disclosure, the use of modulated input signals and demodulated output signals improves the quality of the measured signals by reducing interference from high-voltage noise and increases the accuracy of the measured and calculated results. At the same time, the lower-energy modulated signal may have an insignificant, or at least manageable, effect on the operation of the transformer or other device.

If desired, a system in accordance with this disclosure may have a multi-channel signal generator and measurement device, with connections to input and output sensors for the tested component. The system may provide a series of injected signals into each available port and measure the resulting signals from each available port. Although systems constructed in accordance with this disclosure may be configured differently for different types of equipment being tested, the systems may operate on similar principles. In operation, input signals may be used as the effective carriers for the modulated high-frequency, low-energy signals that pass through the equipment through each electrical path and the resulting voltage and current signals are measured at each available point, and the high-frequency, low-energy component of the signals are demodulated as a series of complex variables to model the insulation system components and determine their capacitance and power factor values.

If desired, for a complete transformer with condenser-type bushings, a system constructed in accordance with the present disclosure may includes sensors on each bushing test tap, sensors on an internal current transformer for each bushing and an external current transformer for each bushing, as well as a connection to the tank ground.

An active monitoring system constructed in accordance with the present disclosure may provide superior signal measurement and phase angle shift determination compared to sinusoidal signal measurement systems, with a lower-energy input signal.

DETAILED DESCRIPTION OF THE EMBODIMENTS

Figure 1:
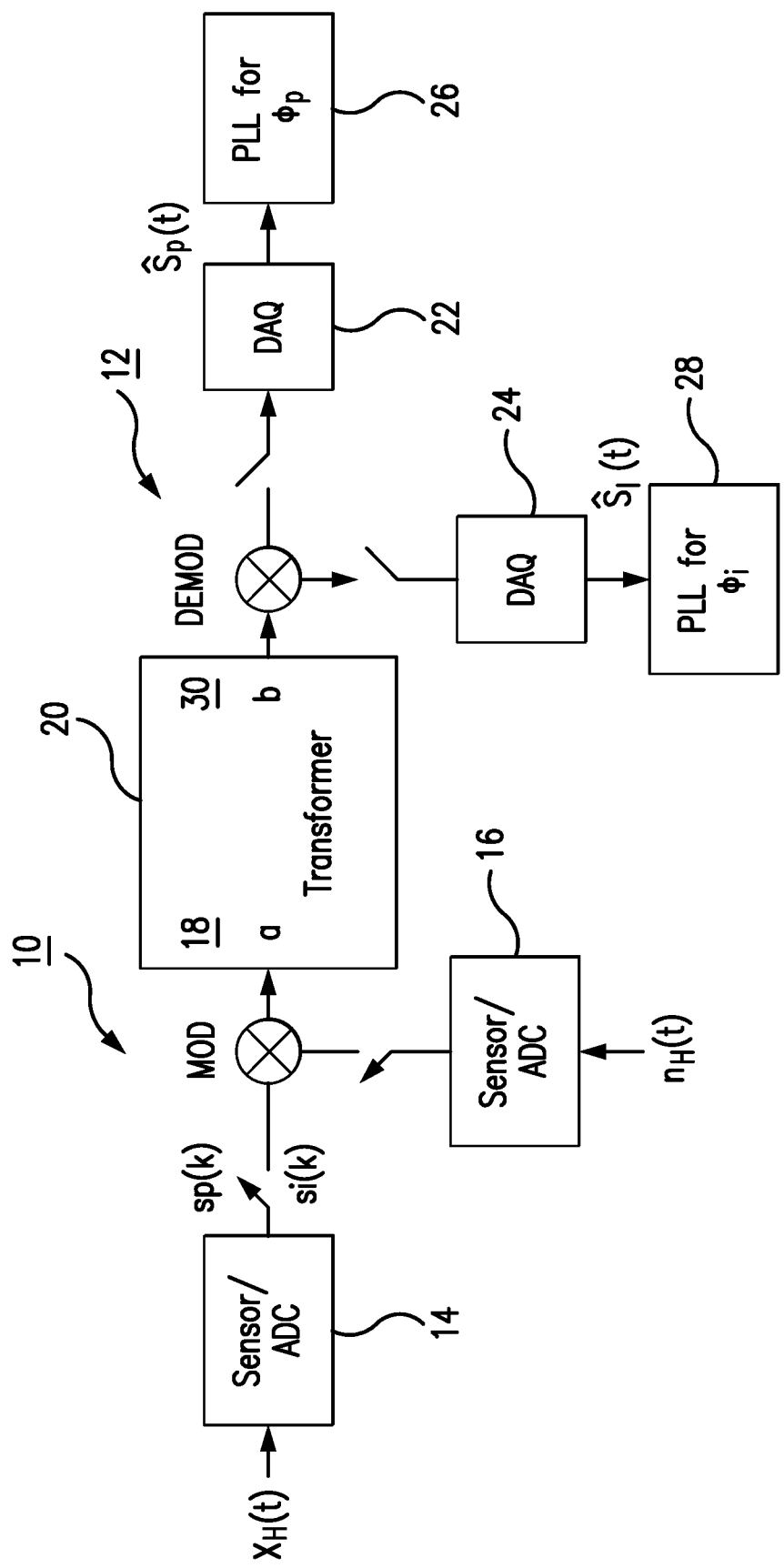
FIG. 1 is a block diagram of an example of a modulation/demodulation system.

Referring now to the drawings, where like elements are designated by like reference numerals or other characters, FIG. 1 illustrates a modulation/demodulation system having a modulation portion 10 and a demodulation portion 12. The modulation portion 10 has a first sensor/analog-to-digital converter device 14 and a second sensor/analog-to-digital converter device 16 for generating a modulated digital signal based on respective analog inputs $x_h(t)$, $n_H(t)$, and for applying the modulated digital signal to a first end 18 of a transformer 20. The demodulation portion 12 has first and second digital-to-analog quantities devices 22, 24 and corresponding phase locked loop devices 26, 28 for demodulating and quantifying a corresponding signal at the second end 30 of the transformer 20.

Figure 2:
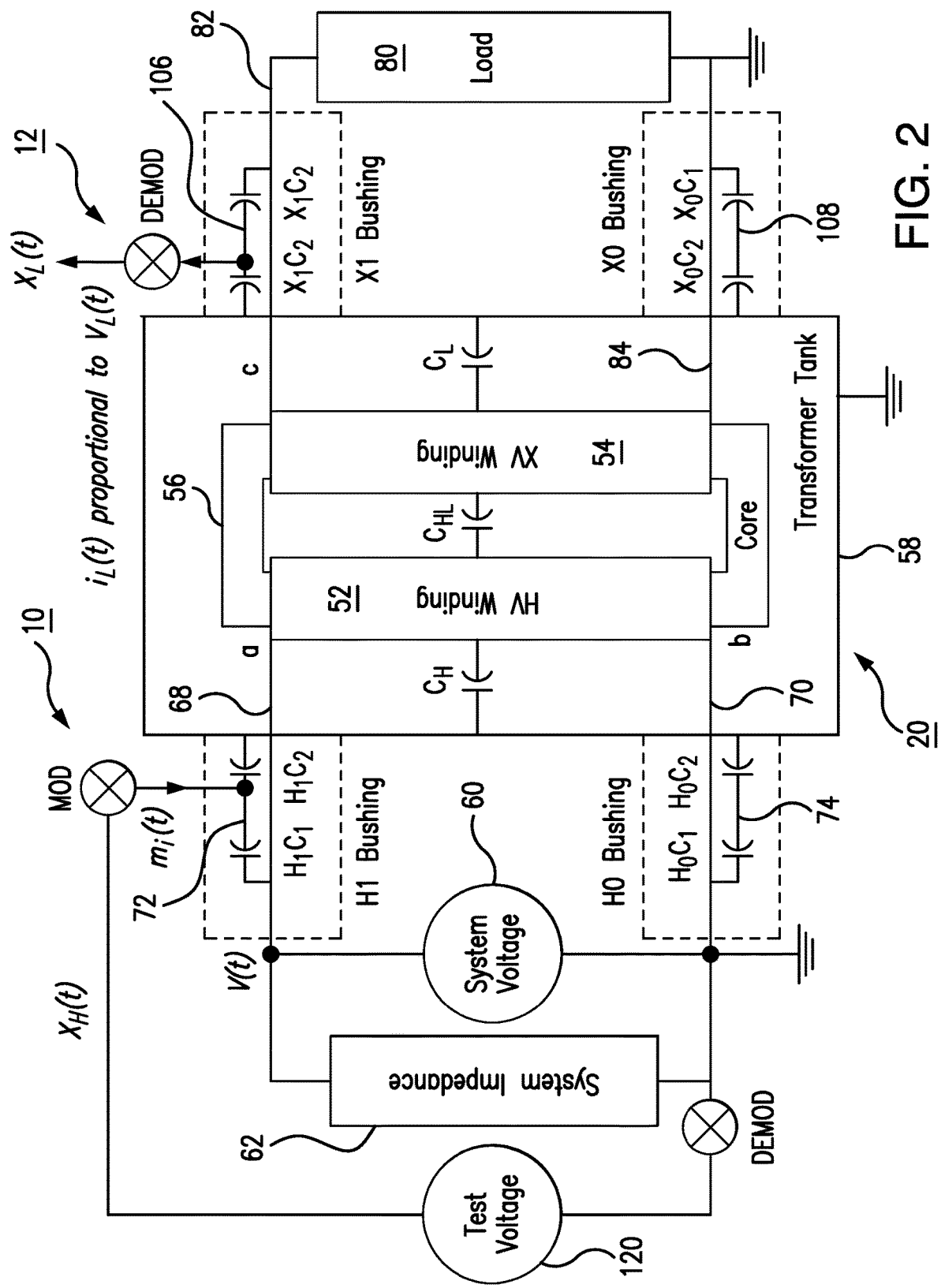
FIG. 2 is a schematic diagram of an example of an active transformer monitoring system, with a digital modulation/demodulation system, connected to a single-phase, two-winding transformer.

FIG. 2 illustrates a single-phase two-winding transformer circuit, where the transformer 20 has a high-voltage (HV) winding 52 and a low-voltage (XV) winding 54 on a core 56. The windings 52, 54 and the core 56 are located within a grounded transformer tank 58. The high-voltage winding 52 has a capacitance $C_H$ to ground, the low-voltage winding 54 has a capacitance $C_L$ to ground, and the high-voltage winding 52 has a capacitance $C_{HL}$ to the low-voltage winding 54.

System voltage 60 and system impedance 62 are electrically connected to first and second ends of the high-voltage winding 52 by suitable first and second conductive lines 68, 70. The first conductive line 68 is electrically insulated from ground by a first bushing H1, while the second conductive line 70 is electrically insulated from ground by a second bushing H0. The bushings H1, H0 have outer and inner bushing sections $H_1C_1$, $H_1C_2$, $H_0C_1$, $H_0C_2$, and test taps 72, 74 located between the respective bushing sections $H_1C_1$, $H_1C_2$, $H_0C_1$, $H_0C_2$. If desired, the first and second bushings H1, H0 may be constructed like the condenser-type bushings illustrated in U.S. Pat. No. 9,945,896, although this disclosure should not be limited to the examples shown and described herein or in U.S. Pat. No. 9,945,896.

First and second ends of the low-voltage winding 54 are electrically connected to first and second ends of a system load 80 by suitable conductive lines 82, 84. The third conductive line 82 is electrically insulated from ground by a third bushing X1, while the fourth conductive line 84 is electrically insulated from ground by a fourth bushing X0. The third and fourth bushings X1, X0 have outer and inner bushing sections $X_1C_1$, $X_1C_2$, $X_0C_1$, $X_0C_2$, and test taps 106, 108 located between the respective bushing sections $X_1C_1$, $X_1C_2$, $X_0C_1$, $X_0C_2$. If desired, the third and fourth bushings X1, X0 may be constructed like the condenser-type bushings illustrated in U.S. Pat. No. 9,945,896.

In operation, a test voltage signal $x_H(t)$ is supplied by a test voltage source 120. The test voltage signal $x_H(t)$ is modulated by a modulation device 10 such that a modulated digital signal $m_i(t)$ is applied to the test tap 72 of the first bushing H1. A demodulation device 12 is connected to the test tap 106 of the third bushing X1 to generate a demodulated signal $x_L(t)$ (where $I_L(t)$ is proportional to $V_L(t)$). Thus, FIG. 2 is an illustration of a simplified circuit model of a two-winding, single-phase transformer 20 with condenser-type bushings H1, H0, X1, X0 showing injected and measured test signals $x_H(t)$, $x_L(t)$.

In the example illustrated in FIG. 2, the transformer 20 is a single-phase, step-down transformer, with a high-voltage (HV) coil 52 and a low-voltage (XV) coil 54 representing the primary and secondary coils of the transformer 20 in the block. The transformer block is non-linear due to the magnetic circuit but is assumed as a causal, linear time invariant (CLTI) system for all practical purposes as the transformer 20 is considered to be operated in the linear region of its B-H curve, typically, at a flux density of 1.7 Tesla (T). Any other specified flux density may need additional changes to the theoretical solution presented below.

Figure 3:
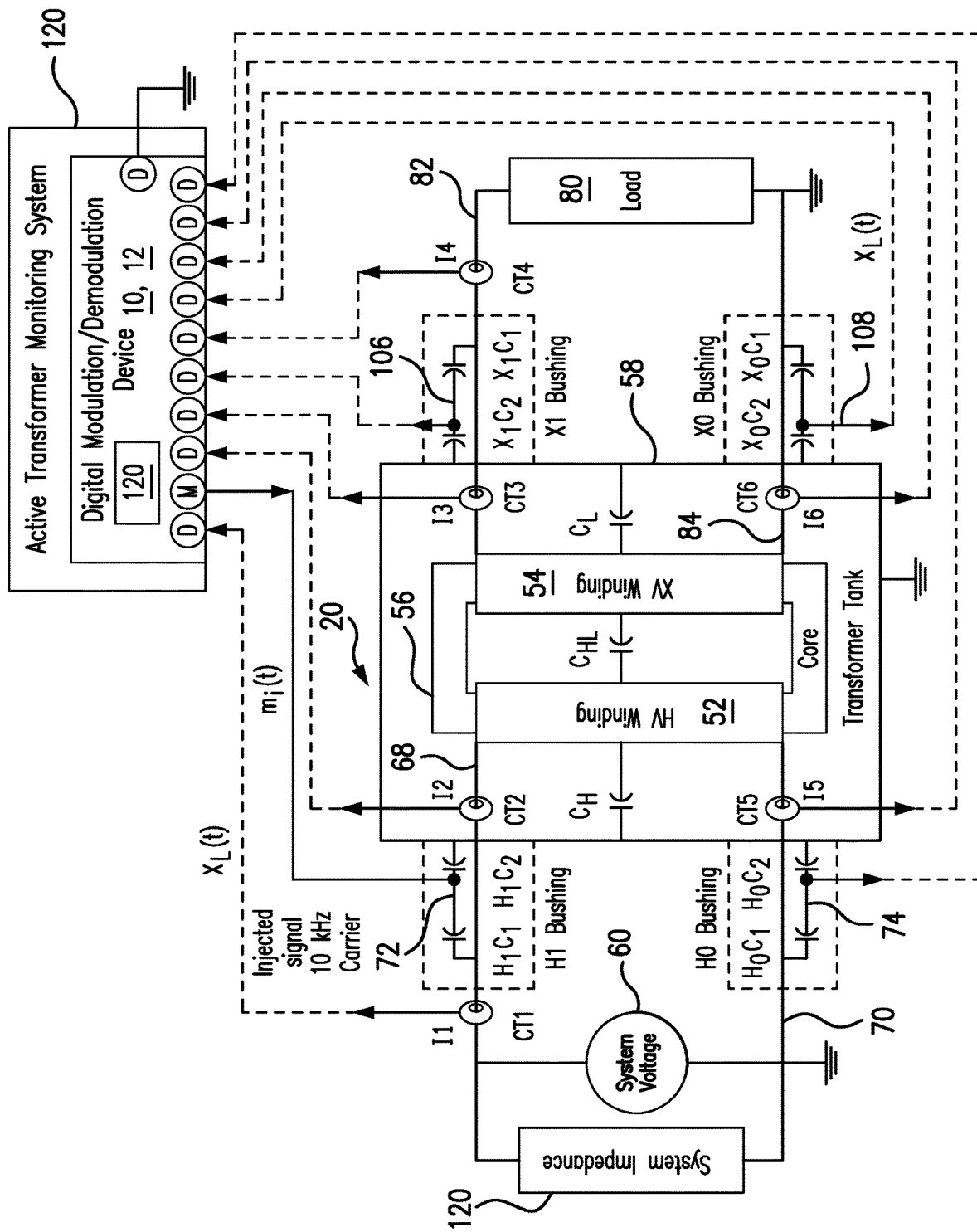
FIG. 3 is another schematic diagram of the active transformer monitoring system and digital modulation/demodulation system of FIG. 2.

FIG. 3 is a more-detailed circuit model of the two-winding, single-phase substation-type transformer 20 with condenser-type bushings H1, H0, X1, X0, where the transformer 20 is shown with multiple available injection and measurement locations. FIG. 3 is discussed herein in connection with injection into the test tap 72 of the first bushing H1 with measurement at the other test taps and current transformers, but other configurations may also be utilized. As illustrated in FIG. 3, the single-phase two-winding transformer 20 may have many input and output sensors and connections to the digital modulation/demodulation system 10, 12. As illustrated in the drawings, the modulation/demodulation system 10, 12 may be an element of an active transformer monitoring system 120.

In operation, a modulated input signal $m_i(t)$, referenced to ground, may be injected into the test tap 72 of the first bushing H1 by the modulation portion 10 ("M" in FIG. 3) of the digital modulation/demodulation system 10, 12. The injected signal $m_i(t)$ is divided between resistive, capacitive, and inductive branches of the transformer circuit as well as a significant portion of the signal that enters the external power system when energized equipment is tested. The injection and measurement cycle continues with the input signal being injected into another bushing test tap (for example, into the test tap 106 of the third bushing X1). After each bushing has cycled and been employed as the input signal bushing, the input connection changes from a ground reference to a bushing-to-bushing reference (for example, from the first bushing H1 to the third bushing X1) for all non-neutral bushings.

For each injection and measurement step in the complete cycle, the portion of the signal that goes to the external power system on the supply side is measured by a first current transformer CT1 and the portion that goes to the load side is measured by a fourth current transformer CT4. The portions of the injected signal that are distributed throughout the internal transformer circuit and the insulation structures (modeled as $C_H$, $C_{HL}$ and $C_L$) are measured by internal current transformers CT2, CT3, CT5, and CT6, and the resulting signals at each bushing H0, X1, and X0 are measured by the sensor on the test tap of each respective bushing. The sequence is repeated with the input sensor being changed to the third bushing X1, then to the second bushing H0, then to the fourth bushing X0, with the resulting signals measured by corresponding current transformer sensors and non-input bushing sensors.

The measured signals are demodulated by the demodulation portion 12 ("D" in FIG. 3) of the modulation/demodulation system 10, 12, and the high-frequency low-energy signal from each measured signal is determined as complex variables to be used in modeling the insulation capacitance and power factor to calculate the transformer $C_H$, $C_{HL}$ and $C_L$ values as well as the bushing $C_1$ and $C_2$ values for each bushing H1, H0, X1, and X0.

In the continuous time domain, a transformer is an electro-magnetic circuit which in its ideal form does not affect a change in the power factor between the primary and secondary circuit, i.e.

$$\mathrm{Cosine}(\theta_i) = \mathrm{Cosine}(\theta_o);$$

where 'i' and 'o' represent the input and output sides respectively

The power signal is represented by v(t), thus $$\text{Power signal} = v(t) \qquad \text{(Equation 1.1)}$$

However, the power signal is corrupted by white noise Gaussian distributed, independent and identically distributed as:

$$S_P(t) = v(t) + n_v(t) \qquad \text{(Equation 1.2)}$$

where:

$$N_v(t) \sim N(o, \sigma_v^2) \qquad \text{(Equation 1.3)}$$

The noise is generally due to a combination of partial discharge, corona, radio interference voltage, and Barkhausen noise in the core at different mid-band frequencies of 150 kHz, 35 kHz and 1 MHz respectively. In the illustrated examples, a suitable filter may be provided for each measurement channel.

As illustrated in FIG. 2, a signal x(t) at a higher frequency; in the illustrated examples, generally a frequency of 10 kHz-100 kHz is injected into the transformer at a bushing capacitor tap. This true test signal X(t) will be corrupted with independent and identically distributed noise $N_x(t)$ making the total injected external signal as $S_i(t)$ as shown in Equation 1.4 below:

$$S_i(t)=X(t)+N_x(t) \quad \text{(Equation 1.4)}$$

This noise can be assumed to be independent and identically distributed with a Gaussian distribution with mean zero and variance $\sigma_x^2$ as:

$$N_x(t) \sim N(0, \sigma_x^2) \quad \text{(Equation 1.5)}$$

Further, as illustrated in FIG. 2, this injected test external signal $s_i(t)$ will be modulated with the power voltage signal $s_p(t)$. Thus, the input to the block of the transformer is given by:

$$\text{MODULATED INPUT: } M_i(t)=s_p(t) \cdot s_i(t) \quad \text{(Equation 1.6)}$$

Let h(t) be the impulse response of the transformer under consideration. Then the output of the transformer may be given by:

$$\text{MODULATED OUTPUT: } M_o(t)=[\text{input}]*h(t) \quad \text{(Equation 1.7)}$$

$$\text{MODULATED OUTPUT: } m_o(t)=[s_p(t) \cdot s_i(t)]*h(t) \quad \text{(Equation 1.8)}$$

Fourier Transform is applied to both the input as in Equation (1.6) and output as in Equation (1.8), which yields:

$$\text{INPUT: } M_I(s)=S_P(s)*S_I(s) \quad \text{(Equation 1.9)}$$

$$\text{OUTPUT: } M_O(s)=[V(s)*S_I(s)] \cdot H(s) \quad \text{(Equation 1.10)}$$

Thus, any changes in the power factor due to changes in the insulation structure caused by failures can be easily assessed after demodulation is conducted at points 'b' and 'c,' by retrieving the original injected signal and finding the changes in the phase angles of the input and output signals. The error in change in the phase angle at the input to the modulator and phase of the output of the demodulator may be tracked by a phase locked loop control circuit. When the error is zero, indicating no change, the power factor of this error is unity. When some error phase angle exists, then the power factor of this error is the error angle itself for a small angle change, for example when $\cos(\theta)=\theta$. The above analysis is in the continuous time domain.

The same data is processed in the digital domain using suitable sensors and digital data acquisition circuits, i.e., analog-to-digital converter s or digital-to-analog quantities and digital filters to create the system. It is imperative to note that Equations (1.9) and (1.10) are in a matrix form and will include all parameters that are necessary to assess the condition of the transformer as a system at different points in the circuit, for example, as illustrated in FIG. 3.

For a digital time domain formulation, the data must be obtained using a suitable sensor and then using a corresponding analog-to-digital converter. The analog-to-digital converter may require a minimum sampling rate of 20 kilo samples/sec or higher as the injected signal frequency increases up to 100 k Hz when the sampling rate will be 200 kilo samples per sec. The sensor will include a low pass filter that can acquire the power signal as in Equation (1.1) from the capacitor tap of the bushing on the respective side of the transformer and pass it on to the analog-to-digital converter. This will be given by:

$$S_p(k); k=1,2,3,\ldots \quad \text{(Equation 1.11)}$$

corrupted with white noise $$N_v(k) \sim N(o, \sigma^2) \text{ independent and identically distributed; } k=1,2,3\ldots \quad \text{(Equation 1.12)}$$

The injected signal as in Equation (1.4) will be inserted using a suitable vector signal generator or a similar vector signal generator and modulated with the power signal passing through the transformer. The digitized injected signal in the illustrated circuit as introduced by the vector generator is given by:

$$S_i(k); k=1,2,3,4\ldots \quad \text{(Equation 1.13)}$$

corrupted with white noise $$N_x(k) \sim N(0, \sigma_x^2) \text{ independent and identically distributed; } =1,2,3,\ldots \quad \text{(Equation 1.14)}$$

This digitized signal as in Equation (1.11), whose continuous version is as in Equation (1.4), is then digitally modulated using phase modulation with the digitized version of the power signal as in Equation (1.13), whose continuous version is as in Equation (1.2). The digitized signals at appropriate measurement levels are obtained by the use of potential or current transformers at strategic points in the circuit as shown in FIG. 3.

The present disclosure illustrates this for a general system for the phase change between points 'a' and 'b' in the circuit illustrated in FIG. 3. A similar step may be conducted for evaluation of phase change between points 'a' and 'c.' The values of the two phase angle changes will indicate the phase change which can be obtained to determine the change in insulation condition. The power in these signals and the corresponding signal-to-noise ratio can be also evaluated by knowing the appropriate impulse response and/or the corresponding transfer function of the transformer circuit. These angles $\Phi_p$ and $\Phi_i$ for the power signal and the injected signal, respectively, may be applied at the high-voltage (HV) side of the transformer 20.

The modulation and demodulation of the power signal and the corresponding injected signals are obtained by using sensors suitable for the power signal at 60 Hz and injected signal at 10 kHz. Suitable filters may be incorporated in the design of the signals at suitable levels needed for measurements. The signals may be modulated using phase modulation scheme. The resulting evaluations of the change in phase angles at points 'a', 'b,' and 'c' yield data in the change in the transfer function in the digital domain generally obtained by Z-transforms of the digitized functions. A change in the phase angles $\Phi_p$ and $\Phi_i$ is obtained as in the continuous time domain analysis using phase locked loop (PLL) circuits 26, 28 in the digital domain and suitable digital-to-analog quantities 22, 24.

Equations (1.7-1.10) are affected in the digital domain to obtain information and characteristics of the change in the phase angle associated with the transformer system due to any change in the core-coil insulation structure caused by any insulation structural failure caused by different faults occurring in the transformer.

FIGS. 2 and 3 illustrate a single-phase two-winding transformer. The number of sensors for a 3-phase two-winding transformer would be increased by approximately 3 times. Transformers with more than two-windings may be equipped with correspondingly more sensors.

The following table lists variables and parameters mentioned in this application.

| Symbol/Variable | Description |
| --- | --- |
| $x_H(t)$ | External signal to be injected on HV |
| $v_H(t)$ | Power voltage signal on HV |
| $x_L(t)$ | External signal received on LV |
| $v_L(t)$ | Power voltage signal on LV |
| $i_L(t)$ | External current signal on LV proportional to $v_L(t)$ |
| $C_{1H}$ | HV- $C_1$ Capacitance at bushing tap |
| $C_{2H}$ | HV- $C_2$ capacitance at bushing tap |
| $C_{1L}$ | LV- $C_1$ Capacitance at bushing tap |
| $C_{2L}$ | LV- $C_2$ capacitance at bushing tap |
| $C_{HS}$ | Primary HV winding series capacitance |
| $C_{HG}$ | Primary HV winding capacitance to ground |
| $C_{LS}$ | Primary LV winding series capacitance |
| $C_{LG}$ | Primary LV winding capacitance to ground |
| $C_{HL}$ | HV to LV winding capacitance |
| GND | System/circuit ground |

Ordinal numbers ("first," "second," "third," etc.) are used herein only to provide clarity and context, and should not be considered limiting except to distinguish similar elements from each other in context.

What have been described above are examples. This disclosure is intended to embrace alterations, modifications, and variations to the subject matter described herein that fall within the scope of this application, including the appended claims. As used herein, the term "includes" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed as new and desired to be protected by Letters Patent of the United States is:

1. An active monitoring system, comprising:
    a modulating portion for generating a digital signal by modulating an input signal, and for injecting the digital signal into a high-voltage device; and
    a demodulating portion for receiving a digital output signal from the high-voltage device, and for demodulating the digital output signal to determine the power factor and capacitance values of an insulation system for the high-voltage device.

2. The active monitoring system of claim 1, wherein the high-voltage device includes a transformer or a reactor.

3. The active monitoring system of claim 2, wherein the insulation system includes an oil-filled condenser bushing.

4. The active monitoring system of claim 1, wherein the system is configured to modulate the injected signal and demodulate a measured complex output voltage and current signals, and thereby enable accurate determination of the capacitance of transformer and related capacitances and power factors of windings.

5. The active monitoring system of claim 4, wherein the system is configured to use low energy signals in de-energized equipment or in energized high-voltage equipment.

6. The active monitoring system of claim 5, wherein the system is configured to determine $C_H$, $C_L$, $C_{HL}$, $C_1$, and $C_2$ capacitances and power factors for condenser-type bushings.

7. The active monitoring system of claim 6, wherein modulated and demodulated signals are not affected by radio interference voltage, corona or partial discharge noise resulting from the high operating voltages and stresses on the insulation system.

8. A method of operating an active monitoring system, comprising:
    using a modulating portion to generate a digital signal by modulating an input signal, and to inject the digital signal into a high-voltage device; and
    using a demodulating portion to receive a digital output signal from the high-voltage device, and to demodulate the digital output signal to determine the power factor and capacitance values of an insulation system for the high-voltage device; and
    wherein the injected digital signal has an energy level that is well below voltage levels that could adversely affect voltage stresses in all areas of the insulation system, but which permits accurate measurement of the resulting output signals.

9. The method of claim 8, wherein an on-line system utilizes data processing through calculations and/or circuit models to determine the 50 Hz or 60 Hz equivalent of traditionally off-line measured bulk capacitance values of an insulation system for a condenser bushing.

* * * * *